United States Patent [19]

Steele

[11] Patent Number: 5,041,741
[45] Date of Patent: Aug. 20, 1991

[54] TRANSIENT IMMUNE INPUT BUFFER

[75] Inventor: David P. Steele, Colorado Springs, Colo.

[73] Assignee: NCR Corporation, Dayton, Ohio

[21] Appl. No.: 582,461

[22] Filed: Sep. 14, 1990

[51] Int. Cl.[5] .................................... H03K 19/094
[52] U.S. Cl. ................................. 307/443; 307/448; 307/451; 307/542
[58] Field of Search ............... 307/443, 448, 451, 496, 307/500, 542, 542.1

[56] References Cited

U.S. PATENT DOCUMENTS

| | | | |
|---|---|---|---|
| 2,860,260 | 11/1958 | Sykes | 307/500 |
| 3,751,682 | 8/1973 | Howe | 307/542.1 |
| 3,898,482 | 8/1975 | Holt, Jr. | 307/327 |
| 3,911,296 | 10/1975 | Davis | 307/297 |
| 4,103,187 | 7/1978 | Imamura | 307/542.1 |
| 4,209,713 | 6/1980 | Satou et al. | 307/200 B |
| 4,409,677 | 10/1983 | Takemae et al. | 307/542 |
| 4,477,736 | 10/1984 | Onishi | 307/297 |
| 4,477,741 | 10/1984 | Moser, Jr. | 307/443 |
| 4,527,077 | 7/1985 | Higuchi et al. | 307/443 |
| 4,754,170 | 6/1988 | Toda et al. | 307/451 |
| 4,785,203 | 11/1988 | Nakamura | 307/448 |
| 4,801,826 | 1/1989 | Cornelissen | 307/482 |
| 4,868,627 | 9/1989 | Tamada et al. | 357/42 |
| 4,908,528 | 3/1990 | Huang | 307/443 |

FOREIGN PATENT DOCUMENTS 2089611 8/1980 United Kingdom .

Primary Examiner—Stanley D. Miller
Assistant Examiner—Scott A. Ouellette
Attorney, Agent, or Firm—Wilbert Hawk, Jr.; Stephen F. Jewett; Douglas S. Foote

[57] ABSTRACT

A transient immune bistable input buffer circuit. The circuit comprises a filter connected between an input and a reference voltage terminal to the circuit for reducing the sensitivity of the circuit to a voltage transient on the terminal.

14 Claims, 3 Drawing Sheets

TRANSIENT IMMUNE INPUT BUFFER

The present invention relates to integrated circuits, and more particularly to input buffers for very large scale integrated (VLSI) circuits.

BACKGROUND OF THE INVENTION

The trend in the design of integrated circuit chips is for ever smaller geometry sizes and increasingly faster switching times. To further improve system speed, bus widths have been expanded with additional parallel input and output lines. Each output pin on a chip has an output driver which provides a relatively large current in response to a weaker signal generated by the chip. As the load on the bus increases, higher current is provided by the output drivers.

Whenever a logic gate on a chip is switched, as for example a logic gate in an output driver, a transient change in the current is created as the load is charged or discharged. Such transient currents create voltage transients in the power or ground path of the chip. The magnitude of voltage transients increases with increased bus width as additional drivers switch at the same time. Similarly, voltage transients increase as a result of the higher current required to drive larger loads.

Logic gates on the same chip, which share the power or ground paths of the output drivers, are known to switch logic states in response to such power or ground path voltage transients. This creates problems for both output and input drivers. For example, a ground transient or "bounce" can cause a high input to be erroneously recognized as a low level by an input buffer of a chip. An input buffer includes an inverter with series connected pull-up and pull-down transistors. The pull-down transistor has its gate connected to the high input and its source connected to ground. When the ground plane is steady, the gate-to-source voltage ($V_{GS}$) is large enough to keep the pull-down transistor "on" which keeps the output low. However, the inverter shares a common ground plane with the output drivers on the same chip. If the ground plane bounces as a result of one or more of the outputs switching, $V_{GS}$ decreases, turning off the pull-down transistor, and erroneously switching the output of the inverter. A similar result occurs for the pull-up transistor as a result of a voltage transient on the power supply.

In the past, attempts to prevent the problems associated with power and ground bounce have concentrated on limiting the magnitude of the voltage transient. A typical method of reducing the voltage transient is to slow the rate at which nodes switch. A disadvantage of this approach is that it increases somewhat the propagation delays through an input/output buffer and pad driver. Furthermore, as chips become faster, input buffers become increasingly sensitive to smaller voltage transients. Further reduction of the magnitude of the voltage transient would considerably increase propagation delays through the input/output buffer and pad driver.

OBJECTS OF THE INVENTION

It is therefore an object of the present invention to provide a new and improved integrated circuit.

It is another object of the present invention to provide a new and improved input buffer for an integrated circuit.

It is a further object of the present invention to provide an input buffer for an integrated circuit which is immune to transients on the power and ground planes.

It is yet another object of the present invention to provide a transient immune input buffer with reduced propagations delays.

SUMMARY OF THE INVENTION

The present invention is a bistable integrated circuit such as an input buffer with reduced sensitivity to transients on a reference voltage terminal to the circuit. The circuit comprises a filter connected between an input and the reference voltage terminal for reducing the sensitivity of the circuit to a voltage transient on the terminal. To prevent transients on both the power and ground voltage terminal from affecting the circuit, filters may be provided on both inputs.

DESCRIPTION OF A PREFERRED EMBODIMENT

Figure 1:
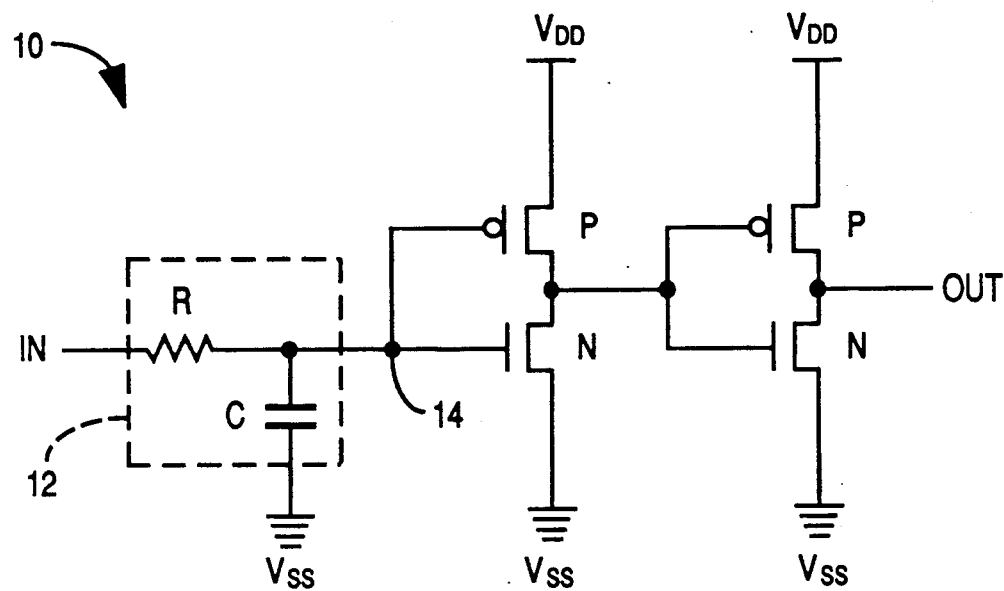
FIG. 1 is a prior art input buffer.

FIG. 1 shows a prior art input buffer 10 with a filter 12 for reducing the sensitivity of buffer 10 to transients on the input line IN. Buffer 10 includes two CMOS inverters, each having complementary PMOS and NMOS field effect transistors P and N, respectively. Filter 12 includes a resistor R connected between the input and the control electrodes of transistors P and N (node 14) of the first inverter, and a capacitor C connected in series with resistor R and reference voltage terminal $V_{SS}$. Filter 12 is a low pass filter for transients appearing on the input. Thus, high frequency voltage transients on the input do not appear on node 14. The typical layout of input filter 12 as an integrated circuit does not provide reduced sensitivity to transients on the ground plane $V_{SS}$. Irrespective of the layout of filter 12 vis-a-vis the first inverter, buffer 10 is sensitive to transients on reference voltage terminals $V_{DD}$.

Figure 2:
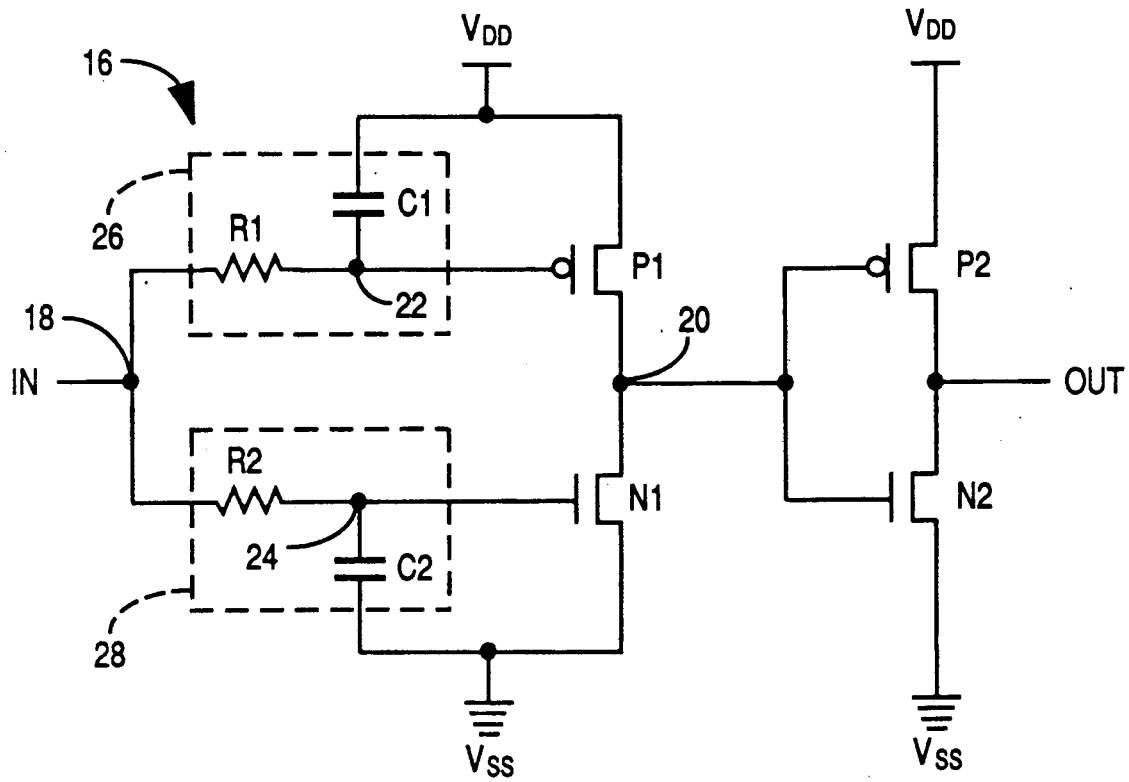
FIG. 2 is an input buffer with inverter according to one form of the present invention.

FIG. 2 is an integrated circuit input buffer 16 having reduced sensitivity to voltage transients on reference voltage terminals $V_{DD}$ and $V_{SS}$. Buffer 16 includes two CMOS inverters, a first inverter having complementary PMOS and NMOS field effect transistors P1 and N1, respectively, series connected between reference voltage terminals $V_{DD}$ and $V_{SS}$, and a second inverter having complementary PMOS and NMOS field effect transistors P2 and N2, respectively, similarly series connected between reference voltage terminals $V_{DD}$ and $V_{SS}$. The input of the second inverter is connected to the output terminal 20 of the first inverter.

A filter 26 which includes a capacitor C1 and resistor R1 is connected between input 18 and reference voltage terminal $V_{DD}$. A filter 28 which includes a capacitor C2 and resistor R2 is connected between input 18 and reference voltage terminal $V_{SS}$. As will be described more fully, filters 26 and 28 significantly reduce the sensitivity of circuit 16 to voltage transients on voltage terminals $V_{DD}$ and $V_{SS}$, respectively, as well as reducing its sensitivity to transients on input terminal 18. Capacitor C1 is connected between reference voltage terminal $V_{DD}$ and node 22, the control electrode of transistor P1. Capacitor C2 is connected between reference voltage terminal $V_{SS}$ and node 24, the control electrode of transistor N1. Input terminal 18 is connected to nodes 22 and 24 through resistors R1 and R2, respectively. Output terminal 20 of the first inverter is connected to the common point between transistors P1 and N1 and is further connected to the input of the second inverter (transistors P2 and N2).

The sizing and layout of resistors R1 and R2, capacitors C1 and C2, and transistors P1 and P2 are important features of the present invention. Resistor R1 and capacitor C1 are sized to form a high pass filter between reference voltage terminal $V_{DD}$ and node 22, and to form a low pass filter between input terminal 18 and node 22. Similarly, resistor R2 and capacitor C2 are sized to form a high pass filter between reference voltage terminal $V_{SS}$ and node 24, and to form a low pass filter between input terminal 18 and node 24. In a preferred embodiment, for $V_{DD}=5$ volts, and $V_{SS}=0$ volts, transistor P1 has a length to width ratio of 5.5, transistor N1 has a length to width ratio of 20.0, resistor R1 is 1000 ohms, capacitor C1 is 1 pf, resistor R2 is 1000 ohms, and capacitor C2 is 3 pf.

Figure 3:
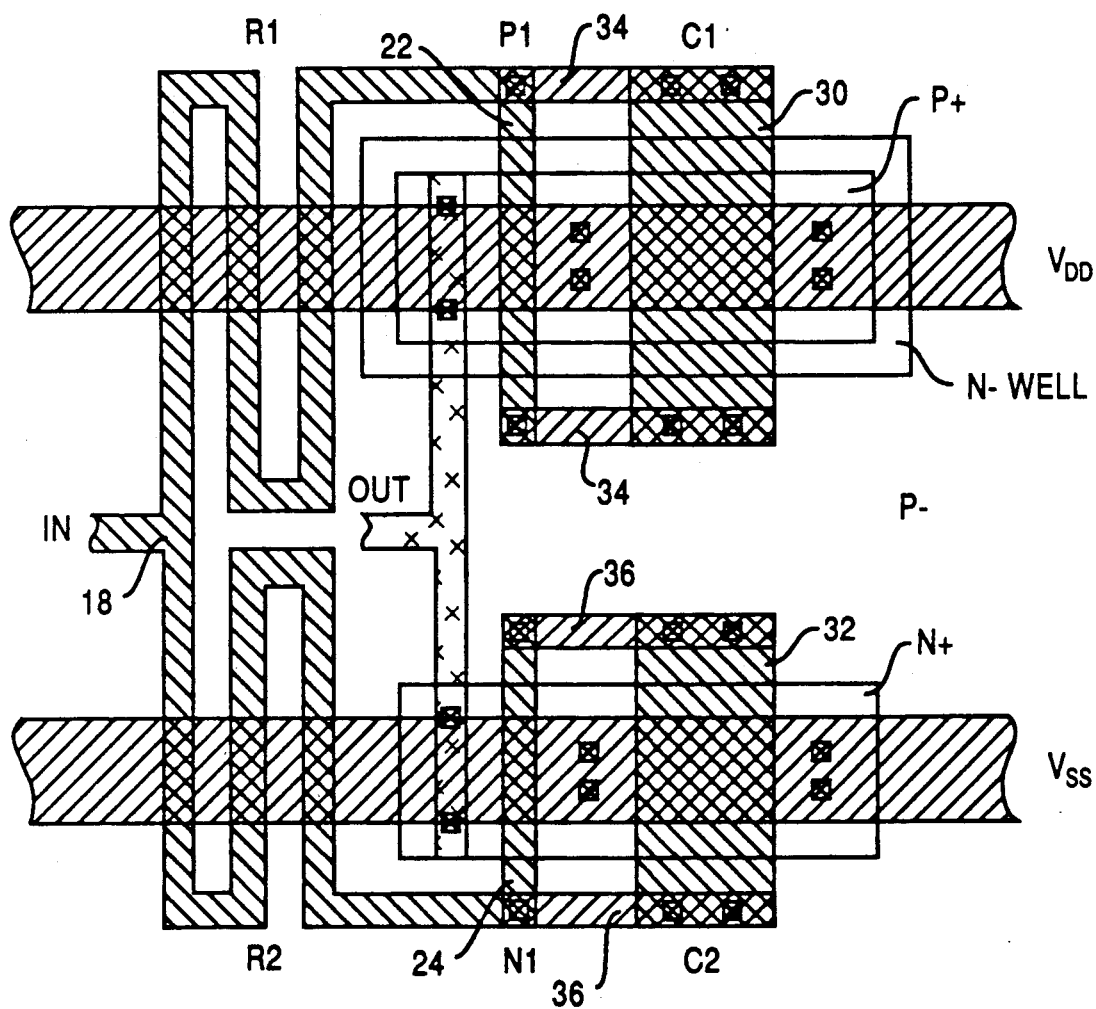
FIG. 3 is an integrated circuit layout of the inverter shown in FIG. 2.

The layout of resistors R1 and R2, capacitors C1 and C2, and transistors P1 and P2 is shown in FIG. 3. The gate or control electrode 22 of transistor P1 is tightly coupled to capacitor C1 and resistor R1 to minimize parasitic capacitance and resistance on electrode 22. Similarly, the gate or control electrode 24 of transistor N1 is tightly coupled to capacitor C2 and resistor R2 to minimize parasitic capacitance and resistance and resistance on electrode 24. In a preferred embodiment, the integrated circuit is laid out on a P-type substrate. PMOS transistor P1 is formed in a P+ region within an N- well, and NMOS transistor N1 is formed in an N+ region. Capacitor C1 is formed by the self-alignment of polysilicon layer 30 and the adjacent P+ regions, and capacitor C2 is formed by the self-alignment of polysilicon layer 32 and the adjacent N+ regions. It will be appreciated that capacitor C1 is formed by using the gate capacitance of a PMOS transistor with its source and drain connected to $V_{DD}$, and capacitor C2 is formed by using the gate capacitance of an NMOS transistor with its source and drain connected to $V_{SS}$. Parasitic capacitance on gate electrode 22 is significantly reduced by connecting electrode 22 to capacitor C1 by metalization runs 34. Parasitic capacitance on gate electrode 24 is significantly reduced by connecting electrode 24 to capacitor C2 by metalization runs 36. Resistor R1 is formed by a serpentine polysilicon run between input node 18 and electrode 22, and resistor R2 is formed by a serpentine polysilicon run between input node 18 and electrode 24. Parasitic resistance on gate electrode 22 is significantly reduced by the short metal runs 34, and parasitic resistance on gate electrode 24 is significantly reduced by the short metal runs 36.

Figure 4:
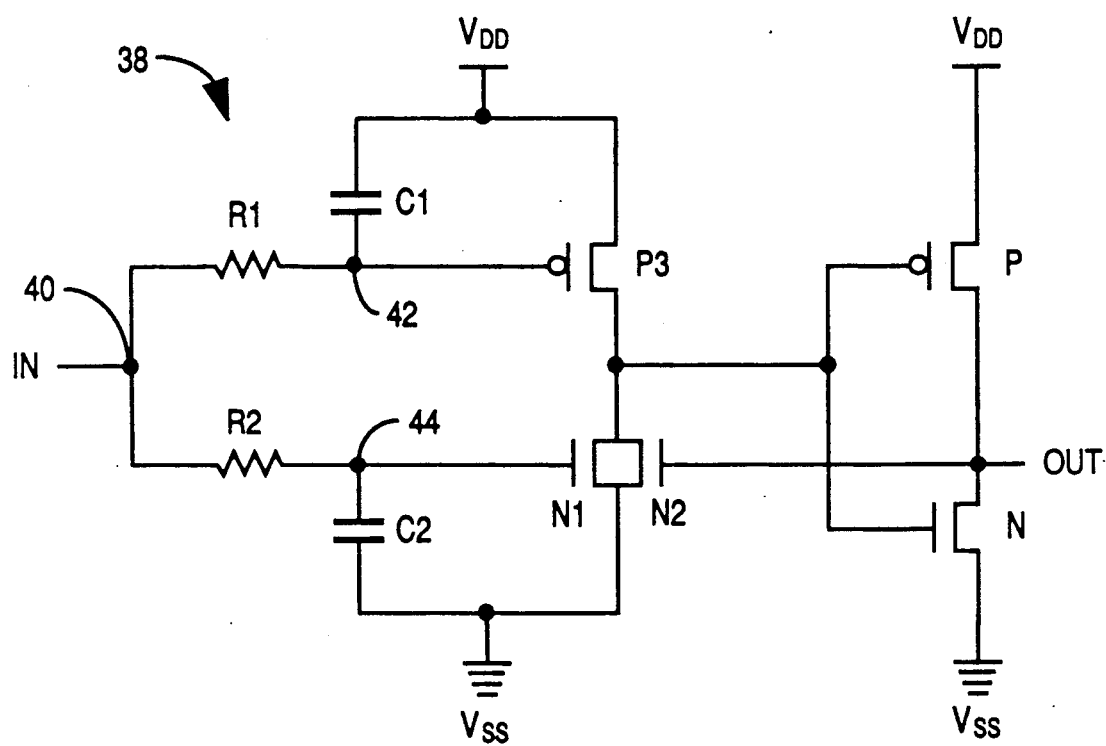
FIG. 4 is a Schmitt trigger according to another form of the present invention.

FIG. 4 shows an alternative embodiment of the present invention in which the input buffer is a Schmitt trigger 38. The first stage of Schmitt trigger 38 includes two level sensitive elements: a PMOS transistor P3 and parallel connected transistors N1 and N2. Transistor P3 and parallel connected transistors N1 and N2 are series connected between reference voltage terminals $V_{DD}$ and $V_{SS}$. As with input buffer 10 shown in FIG. 2, Schmitt trigger 38 includes a capacitor C1 and resistor R1 connected between reference voltage terminal $V_{DD}$ and input 40, and a capacitor C2 and resistor R2 connected between reference voltage terminal $V_{SS}$ and input 40. The common node 42 between capacitor C1 and resistor R1 is connected to the control electrode of transistor P3, and the common node 44 between capacitor C2 and resistor R2 is connected to one of the control electrodes of transistors N1 and N2. The layout of the input filters formed by resistor R1 and capacitor C1 and resistor R2 and capacitor C2 is similar to that shown in FIG. 3.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. An integrated circuit having reduced sensitivity to voltage transients on first and second reference voltage terminals connected thereto, comprising:
   first and second complementary transistors series connected between said first and second reference voltage terminals;
   a first capacitor connected between said first reference voltage terminal and a control electrode of said first transistor;
   a second capacitor connected between said second reference voltage terminal and a control electrode of said second transistor;
   an input terminal connected to the control electrodes of said first and second transistors for receiving an input signal; and
   an output terminal connected to the common point between said first and second transistors for providing an output signal.

2. The circuit of claim 1 further comprising:
   a first resistor connected between the control electrode of said first transistor and said input terminal; and
   a second resistor connected between the control electrode of said first transistor and said input terminal.

3. The circuit of claim 2 wherein said first capacitor and first resistor are sized to form a high pass filter between said first reference voltage terminal and the control electrode of said first transistor.

4. The circuit of claim 2 wherein said second capacitor and second resistor are sized to form a high pass filter between said second reference voltage terminal and the control electrode of said second transistor.

5. The circuit of claim 1 wherein said first and second complementary transistors are PMOS and NMOS field effect transistors, respectively.

6. The circuit of claim 1 further comprising:
   an inverter connected between said first and second reference voltage terminals and having an input connected to said output terminal.

7. A bistable integrated circuit connected to a first reference voltage terminal comprising:
   a first filter connected between an input to said circuit and said first reference voltage terminal for reducing the sensitivity of said circuit to a voltage transient on said terminal;
   wherein said filter is a high pass filter from said first reference voltage terminal to said circuit, and a low pass filter from said input to said circuit.

8. A bistable integrated circuit connected to a first reference voltage terminal comprising:
   a first filter connected between an input to said circuit and said first reference voltage terminal for reducing the sensitivity of said circuit to a voltage transient on said first reference voltage terminal; and
   a first level sensitive element connected to said first reference voltage terminal and having a control electrode coupled to said input;
   wherein said filter includes a resistor connected between said input and control electrode, and a capacitor connected between said control electrode and said first reference voltage terminal.

9. The circuit of claim 8 wherein said control electrode and capacitor are formed on the same doped region to minimize parasitic capacitance on said electrode.

10. The circuit of claim 8 wherein said circuit is further connected to a second reference voltage terminal further comprising:
    a second filter connected between said input and said second reference voltage terminal for reducing the sensitivity of said circuit to a transient voltage on said second terminal.

11. The circuit of claim 10 wherein said second filter is a high pass filter from said second reference voltage terminal to said circuit, and a low pass filter from said input to said circuit.

12. The circuit of claim 10 further comprising:
    a second level sensitive element connected to said second reference voltage terminal and having a control electrode connected to said input;
    wherein said second filter includes a resistor connected between said input and second element control electrode, and a capacitor connected between said second element control electrode and second reference voltage terminal.

13. The circuit of claim 12 wherein said control electrode and capacitor are formed on the same doped region to minimize parasitic capacitance on said electrode.

14. The circuit of claim 10 wherein said level sensitive elements are complementary MOS transistors series connected between said reference voltage terminals.

* * * * *